(12) United States Patent
Niu et al.

(10) Patent No.: US 6,710,680 B2
(45) Date of Patent: Mar. 23, 2004

(54) REDUCED SIZE, LOW LOSS MEMS TORSIONAL HINGES AND MEMS RESONATORS EMPLOYING SUCH HINGES

(75) Inventors: Feng Niu, Weston, FL (US); Wayne W. Chiou, Sunrise, FL (US)

(73) Assignee: Motorola, Inc., Schaumburg, IL (US)

( * ) Notice: Subject to any disclaimer, the term of this patent is extended or adjusted under 35 U.S.C. 154(b) by 108 days.

(21) Appl. No.: 10/029,039

(22) Filed: Dec. 20, 2001

(65) Prior Publication Data

US 2003/0117237 A1 Jun. 26, 2003

(51) Int. Cl.[7] .............. H03H 9/00; H03H 9/05; H03H 9/48
(52) U.S. Cl. .......... 333/186; 333/197; 333/198; 257/415; 257/615; 257/618; 257/619
(58) Field of Search ................... 333/186, 197, 333/198; 257/613, 615, 618, 619, 415

(56) References Cited

U.S. PATENT DOCUMENTS

| | | | | |
|---|---|---|---|---|
| 5,025,346 A | * | 6/1991 | Tang et al. | 361/283 |
| 5,969,465 A | * | 10/1999 | Neukermans et al. | 310/333 |
| 6,067,858 A | * | 5/2000 | Clark et al. | 73/504.16 |
| 6,249,073 B1 | * | 6/2001 | Nguyen et al. | 310/309 |
| 6,497,141 B1 | * | 12/2002 | Turner et al. | 73/105 |

* cited by examiner

Primary Examiner—Barbara Summons

(57) ABSTRACT

Torsional hinge support beams (104, 106, 108, 110, 400, 500, 600, 700, 800, 900, 1000, 1100, 1200, 1300, 1400, 1500) that are corrugated, perforated and/or have non-uniform width are provided. The support beams are useful in flexural beam resonators (100, 1600), in which they serve to support the main flexural mode-vibrating beam (102, 1602). The support beams have phase lengths equal to an odd multiple of $\pi/2$, preferably the phase lengths are about equal to $\pi/2$ at the operating frequency of the resonators. Owing to the corrugations, the lengths of the support beams are shorter than comparable solid straight edge support beams. The short lengths of the support beams reduce the overall area occupied by the resonators and allow higher bias voltage to be employed in order to obtain greater electromechanical coupling.

33 Claims, 9 Drawing Sheets

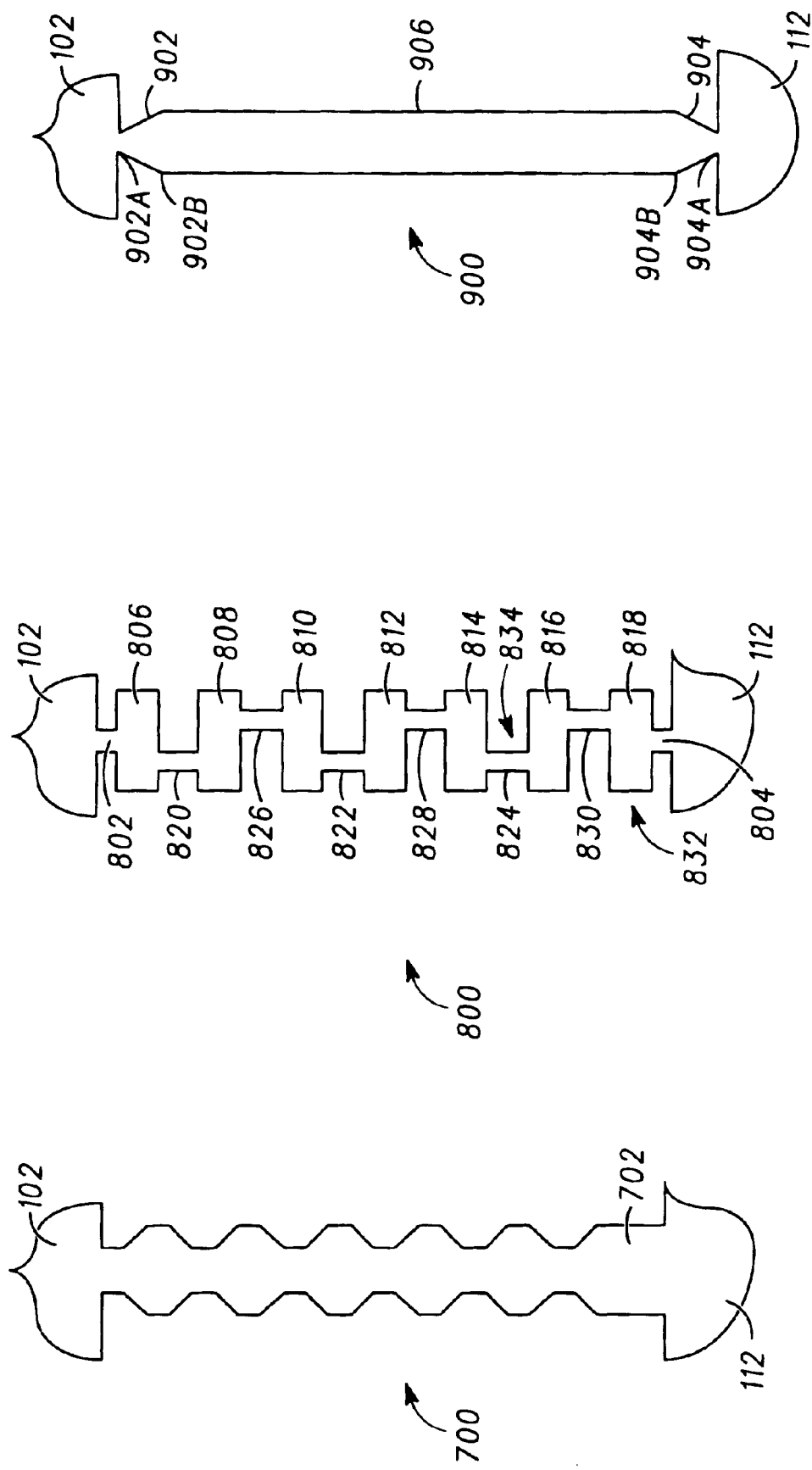

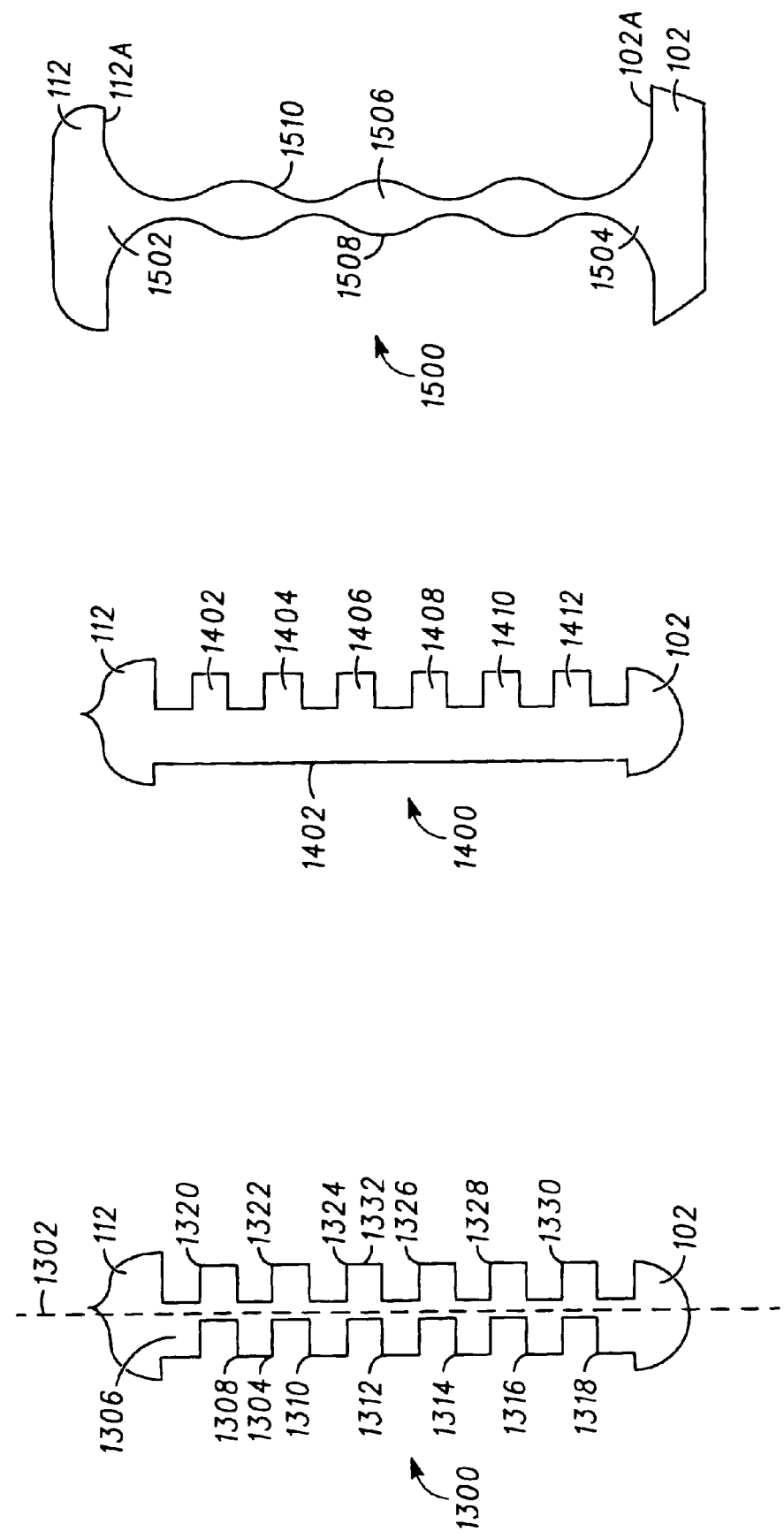

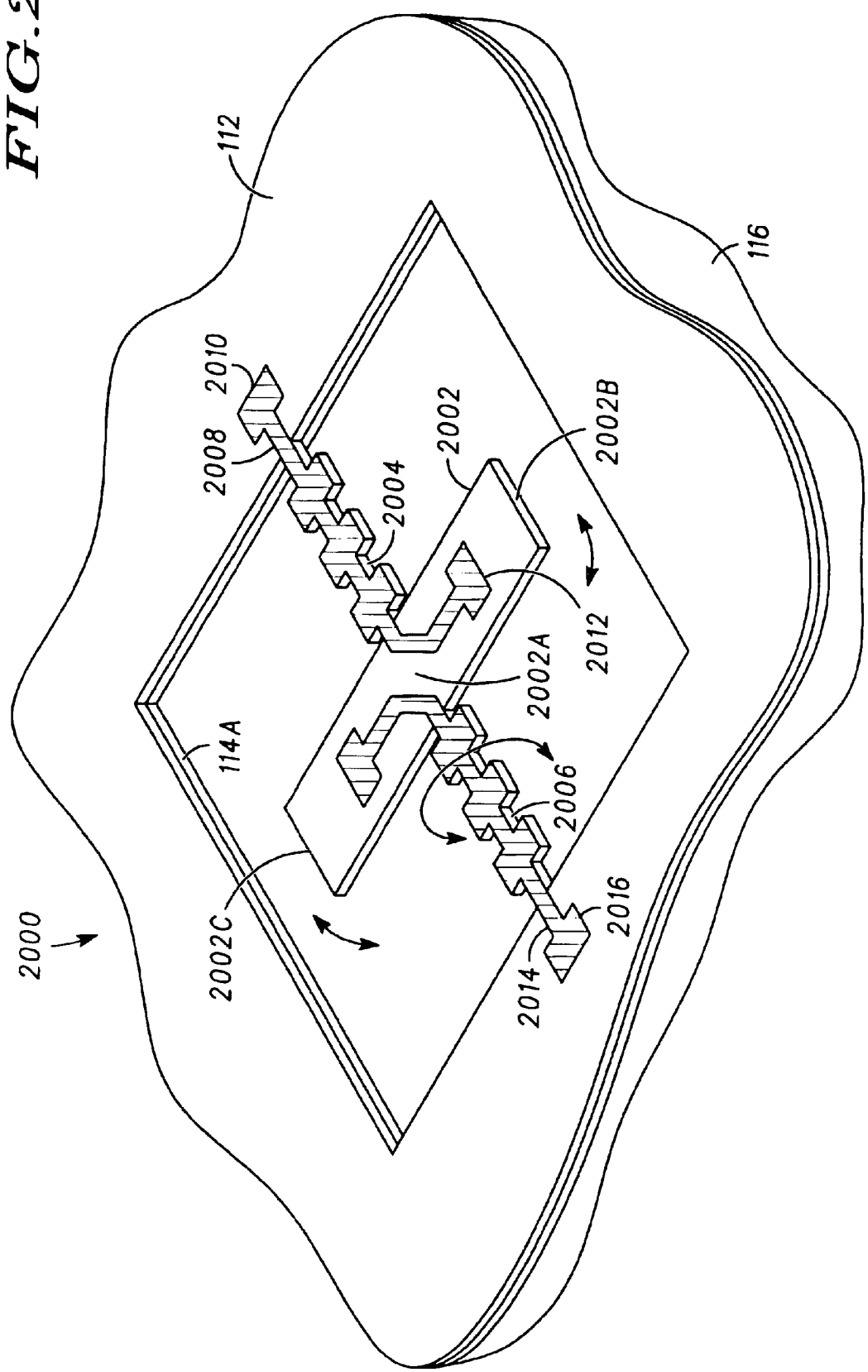

REDUCED SIZE, LOW LOSS MEMS TORSIONAL HINGES AND MEMS RESONATORS EMPLOYING SUCH HINGES

FIELD OF THE INVENTION

The present invention relates to MicroElectroMechanical Systems (MEMS). More particularly, the present invention pertains to frequency selective MEMS devices.

BACKGROUND OF THE INVENTION

Currently, there is an interest in increasing the degree of integration of electronics. Integration has proceeded steadily over the last few decades and achieved remarkable reduction in the physical size occupied by electronic circuits. Semiconductor lithography has enabled circuits with millions of transistors to be constructed on a single silicon die. Nonetheless, certain components are difficult to integrate.

For example, inductors are difficult to integrate. Although, certain spiral shaped designs for integrated circuits have been proposed, owing to their inherent resistive losses, these spiral inductors are ill suited for producing high Q resonators which are needed to generate stable frequency signal sources.

One important component that is used to generate stable frequencies in a variety of electronic apparatus including sequential logic (e.g., microprocessors) and wireless communication transceivers is the quartz crystal resonator. The quartz crystal resonator in its usual form is a bulky discrete component.

Micro ElectroMechanical System (MEMS) based resonators have been proposed as alternatives to quartz resonators for use as frequency selective components at RF frequencies. One type of MEMS resonator that has been proposed comprises a suspended beam of semiconductor material that is shaped and sized to resonate at a selected frequency chosen in view of a desired electrical frequency response. The MEMS resonator serves as a frequency selective component in a circuit. According to one design the MEMS resonator is driven by a drive electrode that extends below the suspended beam. Electric force interaction between the suspended beam and the drive electrode induces the suspended beam to vibrate.

In certain proposed MEMS resonators a main beam that resonates in a flexural mode, is supported by a number of support beams that meet the main beam at right angles, and attach to the main beam at node points of the flexural mode. Each support beam is dimensioned to resonate in a torsional mode that has an anti-node at an end of the support beam that attaches to the main beam, and a node at opposite ends that are anchored to a base on which the resonator is fabricated. The support beams dimensioned in this manner serve to isolate the main beam from the base, and reduce the amount of acoustic energy leaked from the main beam through the anchors into the base. The length of the support beams required to achieve a $\pi/2$ ($\lambda/4$) phase length so as to procure a node at the anchor end and an anti-node at the main beam end greatly increases the overall area required to accommodate the resonator.

In the MEMS resonators described above a bias voltage and a oscillatory voltage component is applied between the main beam and an underlying base. These voltages serve to establish an oscillatory electric force between the main beam and the base that drives main beam into resonance. The vibrations of the main beam serve to reinforce oscillatory voltage components that correspond in frequency to the frequency of vibration of the main beam. The degree of intercoupling between the oscillatory voltage component, and the vibration of the beam depends on the magnitude of the bias voltage. Ordinarily the magnitude bias voltage is limited to being less than a magnitude that will cause the main beam to be pulled down against tension in the support beams until it is a position to mechanically interfere with the base. It would be desirable to provide support beams of increased tensile stiffness so as to allow greater bias voltages to be used.

Although a MEMS resonator occupies very little space compared to an external discrete component it does take up substantial space compared to electrical components found on integrated circuits. A single MEMS resonator can take up space on a semiconductor die that could have been used for hundreds of transistors. In some applications it would be advantageous to be able to reduce the die area occupied by a MEMS resonator.

During the past decade there has been an increased interest in the semiconductor industry in the use of Silicon-On-Insulator (SOI) wafers. SOI wafers include a silicon substrate, a silicon di-oxide layer on the silicon substrate, and a single crystal silicon layer on the silicon di-oxide layer. SOI wafers afford a number of advantages in terms of the electrical properties of circuits built using them, including reduced voltage requirements, and power consumption for a given clock speed.

In a previously filed patent application entitled "MEMS RESONATORS AND METHODS FOR MANUFACTURING MEMS RESONATORS" Ser. No. 09/828,431, filed on Apr. 9, 2001 and assigned to the assignee of the present invention, MEMS resonators fabricated on SOI wafers are disclosed. In the disclosed SOI MEMS resonators, a flexural mode resonant beam and a number of support beams that attach to the flexural mode resonant beam at node points are etched from the single crystal silicon layer. A portion of the silicon di-oxide layer in an area underneath the flexural mode resonant beam, and the support beams is removed by an isotropic etch to allow for free movement of the flexural mode resonant beam and the support beams. It is desirable to minimize the area occupied by such SOI MEMS resonators and at the same time minimize the leakage of acoustic energy from the SOI MEMS resonators.

Application Ser. No. 09/828,431 filed Apr. 9, 2001 is hereby incorporated herein by reference.

What is needed is a MEMS resonator that occupies a relatively small amount of die space while at the same time exhibiting a high resonant quality factor.

BRIEF DESCRIPTION OF THE FIGURES

FIG. 7 is a broken out plan view of a support beam that is used in the MEMS resonator shown in FIGS. 1–3 according to a third alternative embodiment of the invention.

FIG. 8 is a broken out plan view of a support beam that is used in the MEMS resonator shown in FIGS. 1–3 according to a fourth alternative embodiment of the invention.

FIG. 9 is a broken out plan view of a support beam that is used in the MEMS resonator shown in FIGS. 1–3 according to a fifth alternative embodiment of the invention.

FIG. 13 is a broken out plan view of a support beam that is used in the MEMS resonator shown in FIGS. 1–3 according to a ninth alternative embodiment of the invention.

FIG. 14 is a broken out plan view of a support beam that is used in the MEMS resonator shown in FIGS. 1–3 according to a tenth alternative embodiment of the invention.

FIG. 15 is a broken out plan view of a support beam that is used in the MEMS resonator shown in FIGS. 1–3 according to an eleventh alternative embodiment of the invention.

FIG. 20 is a broken out perspective view of a MEMS resonator according to an alternative embodiment of the invention.

DETAILED DESCRIPTION OF THE PREFERRED EMBODIMENTS

Figure 1:
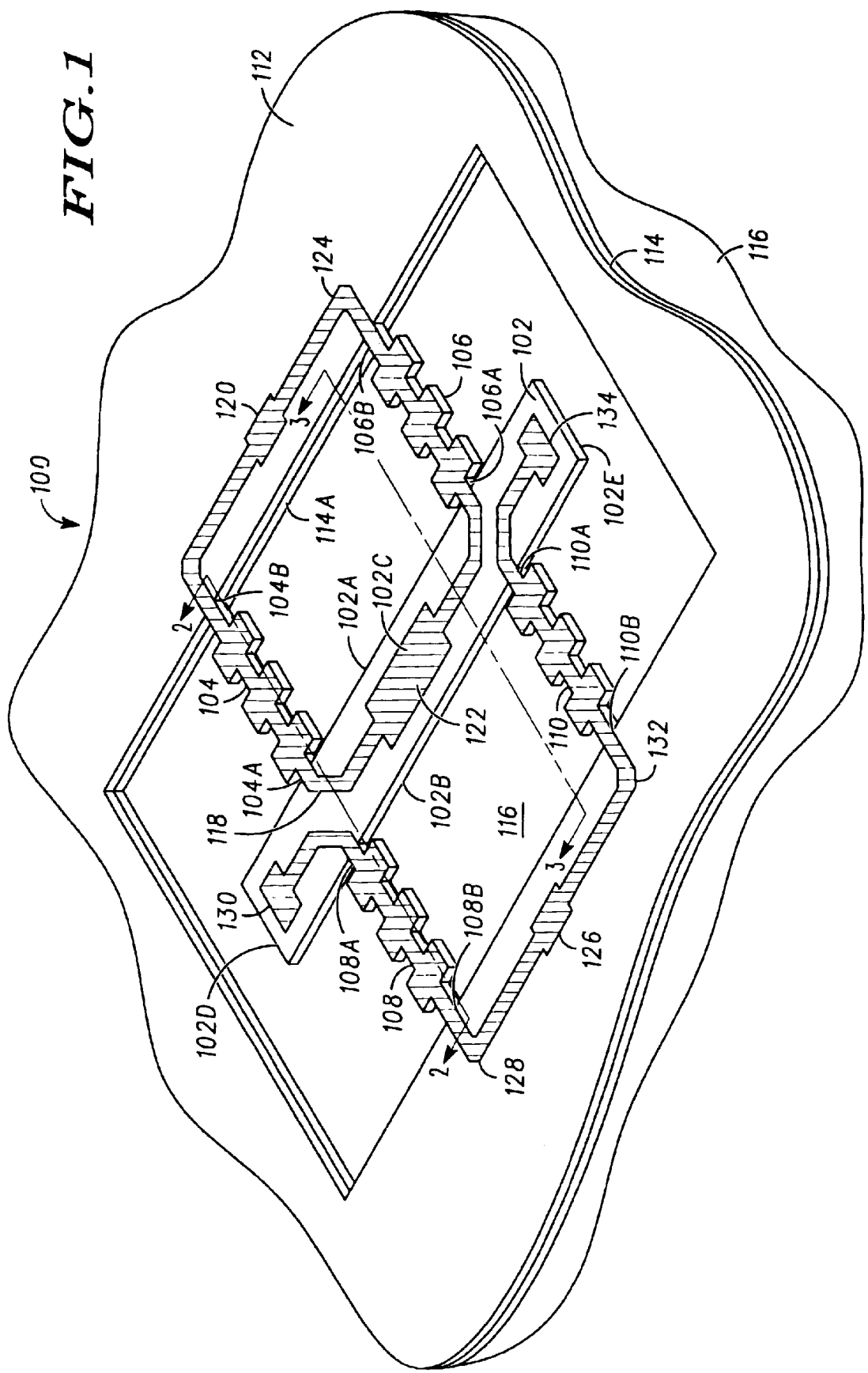
FIG. 1 is a broken out perspective view of a MEMS resonator according to the preferred embodiment of the invention.
Figure 2:
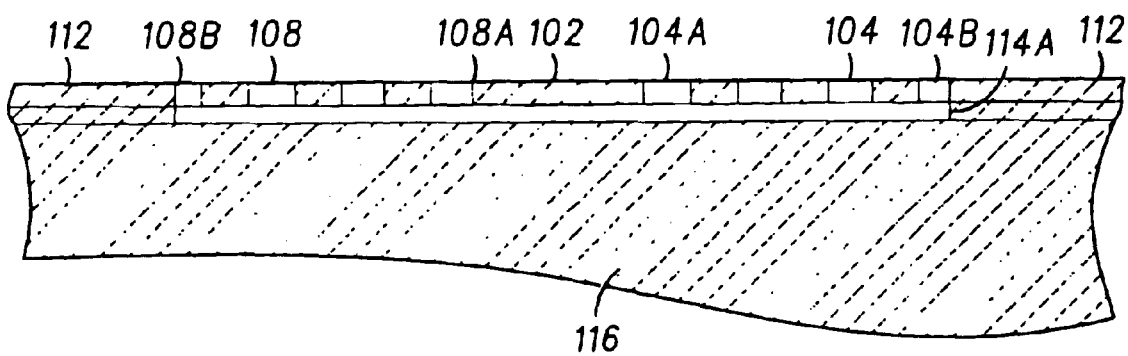
FIG. 2 is a first sectional elevation view of the MEMS resonator shown in FIG. 1
Figure 3:
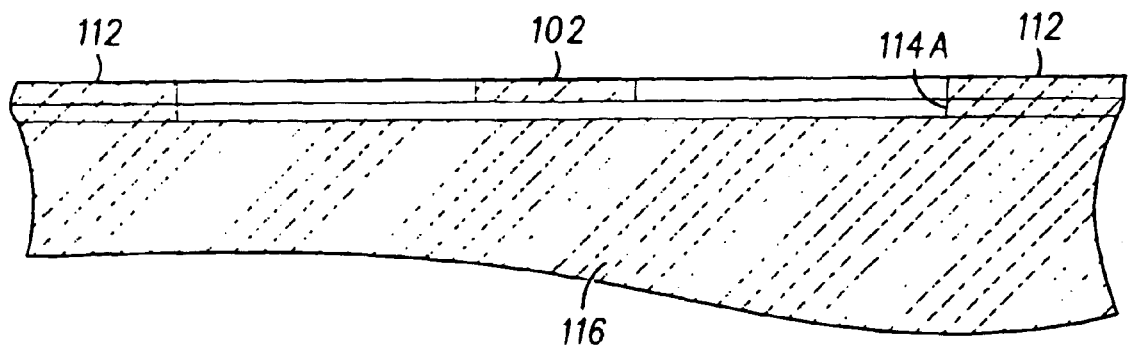
FIG. 3 is a second sectional elevation view of the MEMS resonator shown in FIG. 1.

FIGS. 1–3 show various views of a MEMS resonator 100 according to the preferred embodiment of the invention. FIG. 1 is a broken out perspective view of the MEMS resonator 100, FIG. 2 is a first sectional elevation view of the MEMS resonator 100 shown in FIG. 1, and FIG. 3 is a second sectional elevation view of the MEMS resonator 100 shown in FIG. 1. The section planes of FIGS. 2 and 3 are indicated on FIG. 1.

Referring to FIGS. 1–3, the resonator 100 comprises a main beam 102 that, in operation, vibrates in a flexural beam mode. The main beam 102 is supported by a first elongated support beam 104, a second elongated support beam 106, a third elongated support beam 108, and a fourth elongated support beam 110. The four support beams 104, 106, 108, 110 serve as torsional hinges that allow the main beam 102 to flex. A first end 104A of the first support beam 104, and a first end 106A of the second support beam 106 are connected to (preferably contiguous with) a first longitudinal edge 102A of the main beam 102. A first end 108A of the third support beam 108, and a first end 110A of the fourth support beam 110 are connect to (preferably contiguous with) a second longitudinal edge 102B of the main beam 102 that is opposite and parallel to the first longitudinal edge 102A. The first 104, and third 108 support beams connect to the main beam 102 at a longitudinal position of a first node of the flexural beam mode. The second 106, and fourth 110 support beams connect to the main beam 102 at a longitudinal position of a second node of the flexural beam mode. The support beams 104, 106, 108, 110 are parallel to each other and perpendicular to the main beam 102. Second ends 104B, 106B, 108B, 110B of the four support beams 104, 106, 108, 110 are connected to (preferably contiguous with) a surrounding portion of a first film 112. The surrounding portion of the first film 112 serves to anchor the four support beams 104, 106, 108, 110. Preferably the main beam 102, the four support beams 104, 106, 108, 110, and the surrounding first film 112, are integrally formed by patternwise etching a film. Thus, the four support beams 104, 106, 108, 110 are preferably contiguous with the surrounding first film 112. Alternatively, the surrounding first film 112 may be formed (e.g., by patternwise etching) into a number (e.g., four) of discrete pedestal sections that separately support the four support beams 104, 106, 108, 110. Alternatively the surrounding portion of the first film 112 may be formed in the shape of a peripheral ring (not shown) as shown in the above referenced co-pending application Ser. No. 09/828, 431. When the resonator 100 is used in an integrated circuit, the surrounding portion of the film 112 is preferably used to fabricate electronic or other MEMS components. The first film 112 preferably comprises a monocrystalline material, and more preferably comprises a semiconductor film such as monocrystalline silicon or a III–V semiconductor such as Gallium Arsenide.

The first film 112 overlies a second film 114. The second film 114 preferably extends inward toward the resonator 100 only up to a peripheral edge 114A of the second film 114 thereby leaving a large area that includes areas underneath the main beam 102 and the support beams 104, 106, 108, 110 devoid of the second film 114. The absence of the second film 114 underneath the main beam 102 and the support beams 104, 106, 108, 110 allows the main beam 102 and the support beams 104, 106, 108, 110 to freely vibrate without incurring mechanical interference. The second film 114 preferably comprises a material that may be selectively etched without etching the first film 112. The second film 114 more preferably comprises an oxide selected from the group consisting of perovskites, and silicon dioxide. Alternatively more than one film may be used in lieu of the second film 114.

The second film 114 overlies a base layer 116. The base layer 116 preferably comprises a semiconductor material, more preferably comprises a group IV semiconductor, and still more preferably comprises monocrystalline silicon. The second film 114 preferably comprises a material that may be selectively etched without etching the base layer 116.

The first film 112, second film 114, and base layer 116 may be derived from the three layers that are initially present in a silicon-on-insulator (SOI) wafer. SOI wafers comprise a top monocrystalline silicon layer, a center silicon dioxide layer, and a base of silicon. Methods of manufacturing SOI MEMS resonators such as shown in FIG. 1, although without particular features of the support beams 104, 106, 108, and 110 described below, are described in copending application Ser. No. 09/828,431. Those methods may be applied (with modification of the pattern of the mask that determines an etch pattern of the first film 112) to manufacture the first resonator 100.

A first conductive pathway 118 extends from a first ohmic contact area 120 that is located on the surrounding portion of the first film 112 onto and along the first support beam 104, onto the main beam 102, and along the main beam 102 to a first enlarged electrode area 122 at a center 102C of the main beam 102. A second conductive pathway 124 extends from the first ohmic contact area 120 to and over the second support beam 106 to the main beam 102 and along the main beam 102 to the first enlarged electrode area. A third conductive pathway 128 extends from a second ohmic contact area 126 that is located on the surrounding portion of the first film 112 to and over the third support beam 108 to the main beam 102, and along the main beam 102 to a second enlarged electrode area that is located proximate a first end 102D of the main beam 102. A fourth conductive pathway 132 extends from the second ohmic contact area 126 to and over the fourth support beam 110 to the main beam 102, and along the main beam 102 to a third enlarged electrode area that is located proximate a second end 102E of the main beam 102. The first 120 and second 126 ohmic contact areas, first through fourth 118, 124, 128, 132 conductive pathways and the three enlarged electrode areas 122, 130, 134 are preferably formed by ion implantation doping of the first film 112, prior to an etching operation that forms the main beam 102 and the support beams 104, 106, 108, 110. In FIG. 1, ion implanted areas are shown as cross-hatched areas.

The first ohmic contact area 120 serves as a first terminal of the resonator 100, which as shown is a two-port device. The first terminal is used to apply a bias voltage Vo, and sinusoidal drive voltage component of the form:

$$Vs*\sin(\omega*t+\phi)$$

where Vs the sinusioidal component amplitude

ω the sinusoidal component angular frequency, and

φ is an initial phase offset, to the enlarged electrode area 122. The frequency of the sinusoidal component is preferably about equal to a flexural beam mode resonant frequency of the main beam 102, and to a frequency at which the phase length of the support beams 104, 106, 108, 110 for torsional waves is about equal to an odd multiple of π/2, and more preferably about equal to a frequency at which the phase length of the support beams 104, 106, 108, 110 for torsional waves is about equal to π/2. When applied to the enlarged electrode area 122, the bias voltage in combination with the sinusoidal drive voltage component serve to established a harmonic attractive force between the center 102C of the main beam 102, and a portion of the base layer 116 that underlies the enlarged electrode area 122. The base layer 116 is preferably held at a fixed potential. The harmonic attractive force serves to drive the main beam 102 to vibrate in the flexural beam mode. The three enlarged electrode areas 122, 130, 134 are located away from nodes of the mode of vibration of the main beam, preferably, they are located at antinodes. A current into and out of the second ohmic contact area 126 may be sensed to obtain a sinusoidal signal, the frequency of which is tied to the frequency at which the main beam 102 and the support beams 104, 106, 108, 110 resonate. The first 120 and second 126 ohmic contact areas may be coupled to external circuits by forming an ohmic contact as known to persons of ordinary skill in the art. Oscillator circuits may be used to derive a reference frequency signal from the resonator 100.

Alternatively, the second ohmic contact area 126, third 128, and fourth 132 conductive pathways, and second 130 and third 134 enlarged electrode areas are eliminated, and the resonator 100 serves as a one-port device.

As the main beam 102 vibrates in the flexural beam mode, periodic torque's are applied to the first ends 104A, 106A, 108A, 110A of the first, second, third, and fourth support beams 104, 106, 108, 110 at the frequency of vibration of the main beam 102. The support beams 104, 106, 108, 110 are resonant at the frequency of vibration of the main beam, moreover the support beams 104, 106, 108, 110 have a phase length, in respect to torsional acoustic wave propagation at the frequency of vibration of the main beam 102 that is equal to about an odd multiple of π/2 (λ/4). Preferably, the phase length of the support beams 104, 106, 108, 110 in respect to torsional acoustic waves at the frequency of vibration of the main beam is about π/2 (λ/4). If the phase length of the support beam 104, 106, 108, 110 is an odd multiple of π/2 (λ/4), in operation, torsional antinodes are located at the first ends 104A, 106A, 108A, 110A that are attached to the main beam 102, and a torsional nodes are located at the second ends 104B, 106B, 108B, 110B that are attached to the surrounding portion of the first film 112. Because nodes are located at the second ends 104B, 106B, 108B, 110B, very little acoustic energy will be leaked from the main beam 102, through the support beams 104, 106, 108, 110 to the surrounding portion of the first film 112.

An additional benefit that arises from the fact that support beams 104, 106, 108, 110 are short is that they have high tensional stiffness. Therefore, a higher bias voltage Vo may be employed in order to obtain increased coupling between the vibration of the main beam 102 and the electrical signals coupled to and from the resonator 100 without causing mechanical interference between the main beam 102 and the base layer 116.

The four support beams 104, 106, 108, 110 are preferably corrugated, perforated and/or have widths that vary as a function of position along their lengths. By varying the widths of the support beams 104, 106, 108, 110, corrugating the edges of the support beams 104, 106, 108, 110, or perforating the support beams 104, 106, 108, 110 the lengths of the support beams 104, 106, 108, 110 may be reduced relative to what would be required for unperforated, constant width beams in order achieve phase lengths of π/2 (λ/4) at the frequency of vibration of the main beam 102. Therefore the overall area occupied by the resonator 100 is reduced, and consequently the cost of including the resonator 100 in an integrated circuit is reduced. Corrugated as used in the present application encompasses profiles that repeatedly increase and decrease. Such profiles are typically periodic but may be nonperiodic.

In practice the phase lengths of support beams of various designs are determined using finite element models (FEM). While not wishing to be bound by any specific theory of operation, intuitively it appears plausible that the corrugation serves to increase the phase lengths of the support beams 104, 106, 108, 110 by decreasing the ratio of effective spring constant to the effective mass of the support beams, and by so doing allows the support beams 104, 106, 108, 110 to be shortened.

Figure 4:
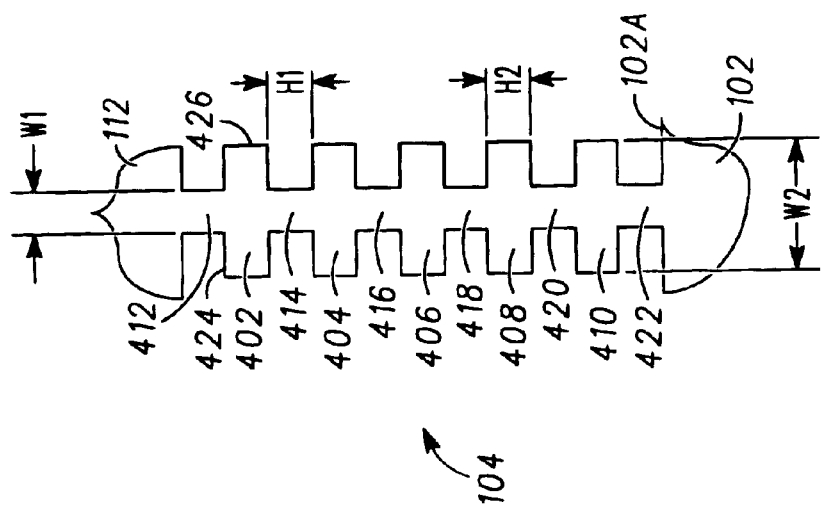
FIG. 4 is a broken out plan view of a support beam that is used in the MEMS resonator shown in FIGS. 1–3 according to the preferred embodiment of the invention.

A description of the corrugated structure of the support beams 104 will be given with reference to the first support beam 104. The structure of the four support beams used in the resonator 100 is preferably the same. FIG. 4 is a broken out plan view of the first support beam 104 that is used in the MEMS resonator 100 shown in FIGS. 1–3 according to the preferred embodiment of the invention. Referring to FIG. 4 the support beam 104 is shown to extend between a broken out portion of the surrounding portion of the first film 112, and a broken out section of the main beam 102. The support beam comprises a first corrugated side edge 424, and a second corrugated side edge 426. The profile of the first 424 and second 426 corrugated side edges are periodic along the length of the support beam 104. The support beam comprise first 402, second 404, third 406, fourth 408, and fifth 410 wide beam sections that alternate in position with first 412, second 414, third 416, fourth 418, fifth 420, and sixth 422 narrow beam sections. The first narrow section 412 is attached to the surrounding portion of the first film 112. The fifth narrow section 422 is attached to the longitudinal edge 102A of the main beam 102 at the position of the first node of the flexural vibration mode of the main beam 102. By attaching the relatively narrow fifth narrow section 422 to the main beam the extent to which the rigidity of the support beam 104 interferes with the flexing of the main beam is reduced. Therefore less energy is dissipated from the main beam 102 by the first support beam (as well as by the other support beams 106, 108, 110, that have the same design). Consequently, the resonant quality factor (Q) of the resonator 100 is improved.

The width w1 and the length h1 of the narrow beams sections 412, 414, 416, 418, 420 are indicated on FIG. 4. The width w2 and the length h2 of the wide beam sections 402, 404, 406, 408, 410 are also indicated on FIG. 4. The length dimensions h1, h2 are preferably scaled down to the smallest possible values which can be fabricated using the semiconductor lithography processes that are used to fabricate the resonator 100. The minimum feature size that can be fabricated declines in a somewhat predictable way from year to year in keeping with Moore's law. The length h1 of the narrow beam sections 412, 414, 416, 418, 420 is preferably about equal to the length h2 of the wide beam sections 402, 404, 406, 408, 410. If the length h2 of the wide beam sections were smaller, effective mass of the first beam 104 would be decreased and its phase length would decrease. If the length of the wide beam sections 402, 404, 406, 408, 410 were larger the time required during manufacturing to etch away portions of the second film 114 that initially underlie the first support arm 104 would increase.

High ratios of average beam width to minimum beam width tend to lead to high ratios of phase length to actual length. On the other hand ratios of average width to minimum width that are too high may lead to support beams that are so short that manufacturing tolerances on their dimensions lead to unacceptable variations in phase length, and may also lead to excitation of undesired modes in the support beams e.g., flexural modes in the wide sections of the support beams. Preferably, the ratio of the average beam width to the minimum beam width for the support beams described herein is between about 1.5 and 7, more preferably the ratio of average beam width to minimum beam width is between about 2 and about 5.

Considering the profile of the support arm 104, proceeding from the surrounding portion of the first film 112, the function that describes the width of the beam 104 as a function of position along its length is seen to comprise a plurality of abrupt increases in width (i.e., in going from each narrow beam section to an adjacent wide beam section) that are interleaved with a plurality of decreases in width (i.e., in going from each wide beam section to a successive narrow beam section). These abrupt width changes characterize one type of support profile that has increased phase length relative to its actual width, compared to a comparable straight side edge support beam.

The varying width of the support beams 104, 106, 108, 110 as illustrated in FIG. 4 allows the support beams 104, 106, 108, 110 to be made relatively short while still maintaining their phase length at $\pi/2$ ($\lambda/4$).

Figure 5:
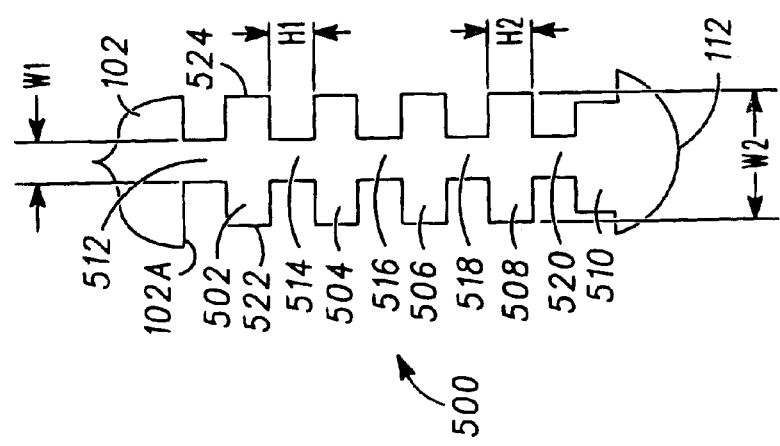
FIG. 5 is a broken out plan view of a support beam that is used in the MEMS resonator shown in FIGS. 1–3 according to a first alternative embodiment of the invention.

FIG. 5 is a broken out plan view of a support beam 500 that is used in the MEMS resonator shown in FIGS. 1–3 according to a first alternative embodiment of the invention. The first alternative support beam 500 is shown extending between the first longitudinal edge 102A of the main beam 102, and the surrounding portion of the first film 112. The first alternative support beam 500 comprises a first corrugated side edge 522 and a second corrugated side edge 524. The first alternative support beam 500 comprises a first 502, a second 504, a third 506, a fourth 508, and a fifth 510 wide beam section, and further comprises a first 512, a second 514, a third 516, a fourth 518, and a fifth 520 narrow beam section. The wide beam sections 502, 504, 506, 508, 510 are interspersed with the narrow beam section 512, 514, 516, 518, 520. The first narrow beam section 512 is attached to the longitudinal edge 102 of the main beam 102. As in the preferred embodiment the attachment of the narrow beam section 512 to the main beam 102 reduces loss of acoustic energy from the main beam 102. In contrast to the preferred embodiment, the first alternative support beam 500 comprises a wide beam section 510 attached to the surrounding portion of the first film 112.

Figure 6:
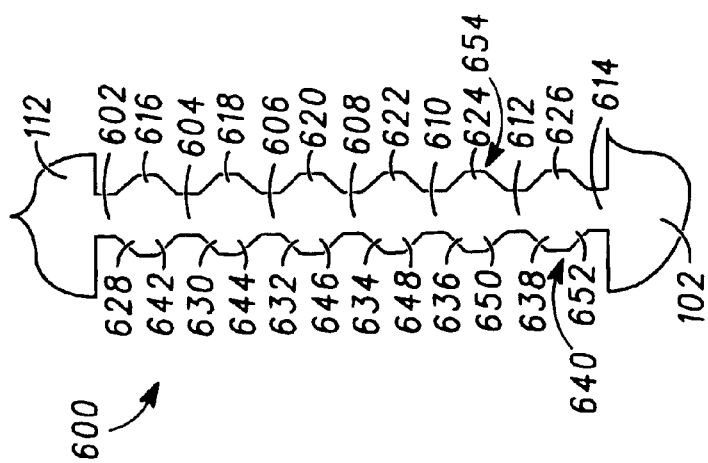
FIG. 6 is a broken out plan view of a support beam that is used in the MEMS resonator shown in FIGS. 1–3 according to a second alternative embodiment of the invention.

FIG. 6 is a broken out plan view of a support beam 600 that is used in the MEMS resonator shown in FIGS. 1–3 according to a second alternative embodiment of the invention. The third support beam 600 is shown extending between the main beam 102, and the surrounding portion of the first film 112. The third support beam 600 comprises a first corrugated side edge 640, and second corrugated side edge 654 opposite the first corrugated side edge 640. The third support beam comprises a plurality of narrow beam sections 602, 604, 606, 608, 610, 612, 614 that alternate in position with a plurality of wide beam sections 616, 618, 620, 622, 624. A first plurality of tapered width sections 628, 630, 632, 634, 636, 638 that have widths that decrease as the distance from the main beam increases are interposed between the narrow beam sections 602, 604, 606, 608, 610, 612 and the wide beam sections 616, 618, 620, 622, 624. A second plurality of tapered width sections 642, 644, 646, 648, 650, 652 that have widths that increase as the distance from the main beam 102 increases are interposed between the narrow beam sections 602, 604, 606, 608, 610, 612 and the wide beam sections 616, 618, 620, 622, 624. Narrow ends of the tapered width sections 628, 630, 632, 634, 636, 638, 642, 646, 648, 650, 652 are connected to the narrow width beam sections 602, 604, 606, 608, 610, 612, 614. By providing the tapered width sections 628, 630, 632, 634, 636, 638, 642, 646, 648, 650, 652, stress concentrations in the third support beam 600 are reduced. As in the preferred embodiment narrow sections 602, 614 are connected to the main beam 102 and to the surrounding portion of the first film 112.

FIG. 7 is a broken out plan view of a support beam 700 that is used in the MEMS resonator shown in FIGS. 1–3 according to a third alternative embodiment of the invention. The third alternative support beam 700 is similar to the second alternative support beam 600 but has a wide beam section 702 attached to the surrounding portion of the first film 112.

FIG. 8 is a broken out plan view of a support beam 800 that is used in the MEMS resonator 100 shown in FIGS. 1–3 according to a fourth alternative embodiment of the invention. The fourth alternative support beam 800 comprises a first narrow beam section 802 that is attached to the main beam 102, and an eighth narrow beam section 804 that is attached to the surrounding portion of the first film 112. The first 802 and eighth narrow beam sections are co-linear. A second 820, a fourth 822, and a sixth 824 narrow beam section are co-linear with each other and offset in a first direction from the first 802, and eighth 804 narrow beam sections. A third 826, a fifth 828, and a seventh 830 narrow beam sections are co-linear with each other and offset in a second direction from the first 802 and eighth 804 narrow beam sections. First 806, second 808, third 810, fourth 812, fifth 814, sixth 816, and seventh 818 wide beam sections are interspersed between the narrow beam sections 802, 820, 826, 828, 824, 830, 804. The fourth alternative support beam is bounded by a first corrugated side edge 832 and a second corrugated side edge 834, both of which extend from the surrounding portion of the first film 112 to the main beam 102.

FIG. 9 is a broken out plan view of a support beam 900 that is used in the MEMS resonator shown in FIGS. 1–3 according to a fifth alternative embodiment of the invention. The fifth alternative support beam 900 comprises a first tapered section 902 that is attached to the main beam 102, a central constant width portion 906 that is attached to the first tapered section 902, and a second tapered section 904 that is attached to the central constant width portion 906 and to the surrounding portion of the first film 112. The first tapered section 902 comprises a narrow end 902A that is attached to the main beam 102, and a wide end 902B that is attached to the central constant width portion 906. Similarly, the second tapered section 904 includes a narrow end 904A that is attached to the surrounding portion of the first film 112, and a wide end 904B that is attached to the central constant width portion 906. The wide ends 902B, 904B of the tapered sections 902, 904 are as wide as the central constant width portion 906.

By attaching the narrow end 902A of the first tapered section 902 to the main beam 102, the degree to which flexing of the main beam 102 as it vibrates leads to flexing fifth alternative support beam 900 is reduced and the loss of acoustic energy from the resonator 100 through the fifth alternative support beam 900 is reduced.

Figure 10:
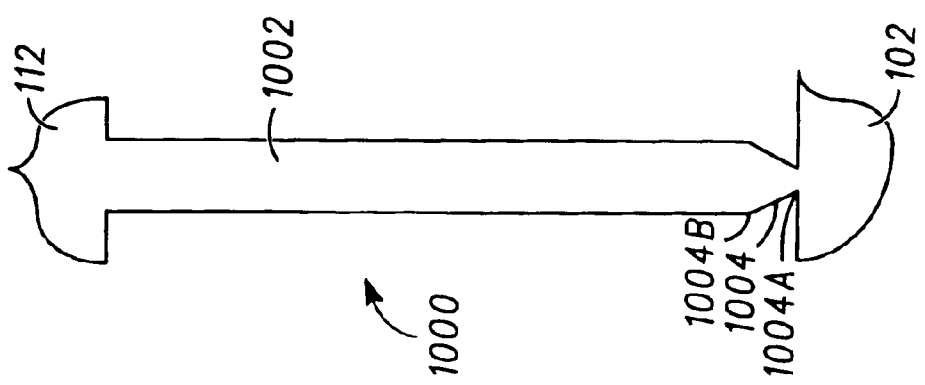
FIG. 10 is a broken out plan view of a support beam that is used in the MEMS resonator shown in FIGS. 1–3 according to a sixth alternative embodiment of the invention.

FIG. 10 is a broken out plan view of a support beam 1000 that is used in the MEMS resonator shown in FIGS. 1–3 according to a sixth alternative embodiment of the invention. The sixth alternative support beam 1000 comprises a constant width portion 1002 that is attached to the surrounding portion of the first film 112 and to a wide end 1004B of a tapered section 1004. A narrow end 1004A of the tapered section 1004 is attached to the main beam 102. By attaching the narrow end 1004A of the tapered section 1004 to the main beam, the loss of acoustic energy from the main beam 102 and from the resonator 100 as a whole is reduced.

Figure 11:
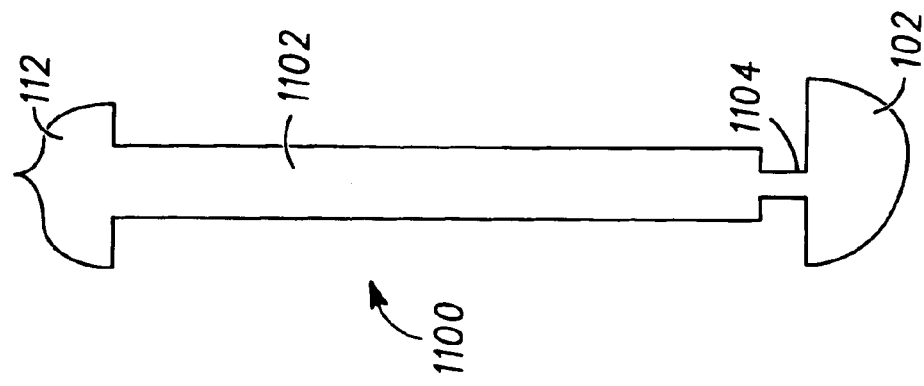
FIG. 11 is a broken out plan view of a support beam that is used in the MEMS resonator shown in FIGS. 1–3 according to a seventh alternative embodiment of the invention.

FIG. 11 is a broken out plan view of a support beam 1100 that is used in the MEMS resonator shown in FIGS. 1–3 according to a seventh alternative embodiment of the invention. The seventh alternative support beam 1100 comprises a wide beam section 1102 that is attached to the surrounding portion of the first film 112, and a shorter narrow beam section 1104 that is attached to the wide beam section 1102 and to the main beam 102. By attaching the narrow beam section 1104 to the main beam 102 the loss of acoustic energy from the main beam 102 and from the resonator 100 as whole is reduced.

Figure 12:
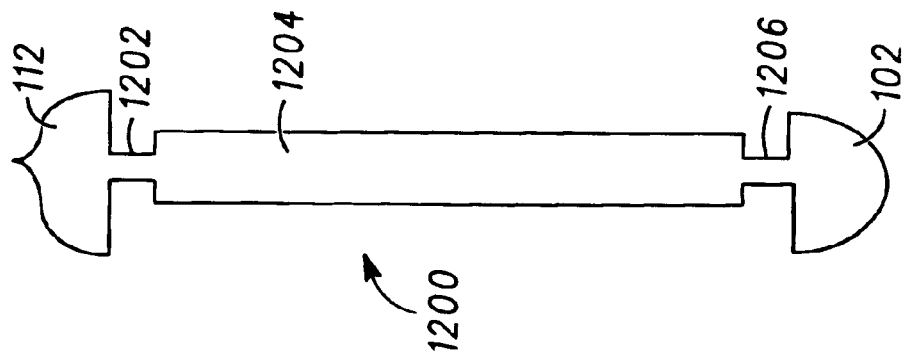
FIG. 12 is a broken out plan view of a support beam that is used in the MEMS resonator shown in FIGS. 1–3 according to an eighth alternative embodiment of the invention.

FIG. 12 is a broken out plan view of a support beam 1200 that is used in the MEMS resonator shown in FIGS. 1–3 according to an eighth alternative embodiment of the invention. The eight alternative support beam 1200 comprises a first narrow beam section 1202 that is attached to the surrounding portion of the first film 112 and to a wide beam section 1204. The wide beam section 1204 is also attached to a second narrow beam section 1206. The second narrow beam section 1206 is also attached to the main beam 102. By providing the second narrow beam section 1206 attached to the main beam 102, the loss of acoustic energy from the main beam 102 and from the resonator 102 as a whole is reduced.

FIG. 13 is a broken out plan view of a support beam 1300 that is used in the MEMS resonator shown in FIGS. 1–3 according to a ninth alternative embodiment of the invention. The ninth support beam comprises a first plurality of beam sections 1306, 1308, 1310, 1312, 1314, 1316, 1318 that have a predetermined width. The ninth support beam further comprises a second plurality of beam sections 1320, 1322, 1324, 1326, 1328, 1330 that have the predetermined width. Beam sections in the first plurality alternate in position along the ninth alternative support beam 1300 with beam sections in the second plurality of beam sections. As shown, in the ninth alternative support beam 1300 all of the beam sections have the same predetermined width. The first plurality of beam sections 1306, 1308, 1310, 1312, 1314, 1316, 1318 is offset toward a first side of a central axis 1302 of the ninth alternative support beam 1300, whereas the second plurality of beam sections 1320, 1322, 1324, 1326, 1328, 1330 is offset toward an opposite side of the central axis 1302. The ninth alternative support beam 1300 has a first corrugated side edge 1304 and a second corrugated side edge. The ninth alternative support beam 1300 is unique among other support beam embodiments in that although it also has a corrugated side edge, its width is invariant along its length. Although the ninth alternative support beam 1300 has rectilinear corrugated side edges, alternatively smoothly contoured corrugated side edges are employed while still preserving the constant width attribute.

FIG. 14 is a broken out plan view of a support beam 1400 that is used in the MEMS resonator shown in FIGS. 1–3 according to a tenth alternative embodiment of the invention. The tenth alternative support beam 1400 includes a strait side edge 1402, and a corrugated side edge 1414. The set of protruding tabs 1402, 1404, 1406, 1408, 1410, 1412 extend to the side of beam 1400, thereby defining the corrugated side edge 1414.

FIG. 15 is a broken out plan view of a support beam 1500 that is used in the MEMS resonator shown in FIGS. 1–3 according to an eleventh alternative embodiment of the invention. The eleventh alternative support beam 1500 comprises a center section 1506 that is characterized by width that is a smooth continuous periodic function of position along its length. A first transition section 1502 is connected between the surrounding portion of the first film 112 and the center section 1506. A second transition section 1504 is connected between the center section 1502, and the main beam 102. The contour of the first 1502 and second 1504 transitions sections are smooth (i.e., differentiable at least up to first order) and join smoothly (i.e., in such a manner that the joined curve is differentiable, at least up to first order) to the center section of the beam 1506, to the main beam 102, and to the surrounding portion of the first film 112. The eleventh alternative support beam 1500 comprises a first corrugated side edge 1508 and a second corrugated side edge 1510.

Figure 16:
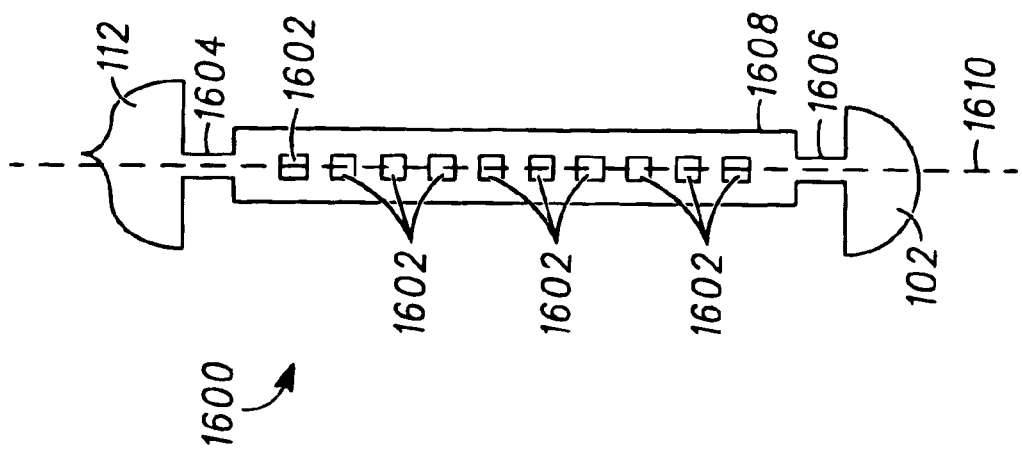
FIG. 16 is a broken out plan view of a support beam that is used in the MEMS resonator shown in FIGS. 1–3 according to a twelfth alternative embodiment of the invention.

FIG. 16 is a broken out plan view of a support beam 1600 that is used in the MEMS resonator shown in FIGS. 1–3 according to a twelfth alternative embodiment of the invention. The twelfth alternative support beam 1600 comprises a first narrow beam section 1604 that is coupled between the surrounding portion of the first film 112, and a wide beam section 1608, and a second narrow beam section 1606 that is coupled between the wide beam section 1608, and the main beam 102. A row of holes 1602 are located on the wide beam section 1608 along a central longitudinal axis 1610 of the twelfth alternative support beam 1600. The holes 1602 extend through the support beam 1600. The row of holes 1602 serve to lower the resonant frequencies of the twelfth support beam 1600 so that the ratio of its phase length to its physical length is shorter than it would be if the row of holes 1602 were absent. Therefore a resonator that employees support beams of the type shown in FIG. 12, may be made smaller while still maintaining the phase length of the support beams at λ/4 and consequently avoiding large losses of acoustic energy through the support beams. Furthermore, by providing the row of holes 1602, an etch time that is required to remove a portion of the second film 114 that initially (during manufacturing) underlies the support beam 1600 is reduced.

Figure 17:
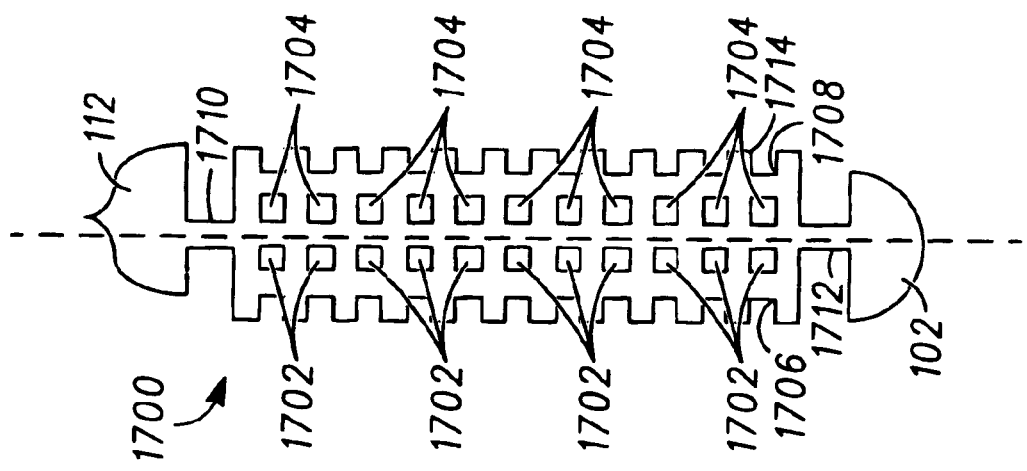
FIG. 17 is a broken out plan view of a support beam that is used in the MEMS resonator shown in FIGS. 1–3 according to a thirteenth alternative embodiment of the invention.

FIG. 17 is a broken out plan view of a support beam 1700 that is used in the MEMS resonator shown in FIGS. 1–3 according to a thirteenth alternative embodiment of the invention. The thirteenth alternative support beam 1700 includes a first narrow beam section 1710 that is connected to the surrounding portion of the first film 112, and a second narrow beam section 1712 that is connected to the main beam 102. A wide beam section 1714 extends between the first narrow beam section 1710 and the second narrow beam section 1712. The wide beam section 1714 comprises a first corrugated side edge 1706, and a second corrugated side edge 1708. A first 1702 row of holes and a second row of holes 1704 are arranged on the wide beam section 1714. The two rows of holes 1702, 1704 and the first 1706 and second 1708 corrugated side edges serve to increase the phase length of the In the thirteenth alternative support beam 1700 relative to its physical length compared to what the phase length would be in a solid (hole free) straight edge support beam. The two rows of holes 1702, 1704 also serve to decrease an etch time required to remove a portion of the second film 114 that initially underlies the support beam 1700. The size and spacing of holes in the two rows of holes 1702, 1704, and the pitch of the corrugations of the first 1706 and second 1708 corrugated side edges is preferably approximately equal to the minimum feature size of features that can be fabricated using the semiconductor fabrication process with which the support beam 1700 is fabricated. As mentioned above the minimum feature size decreases from year to year in keeping with Moore's law. By using the a feature size close the minimum achievable feature size, the time required to etch the portions of the second film that initially underlie the support beam 1700 is reduced.

Figure 18:
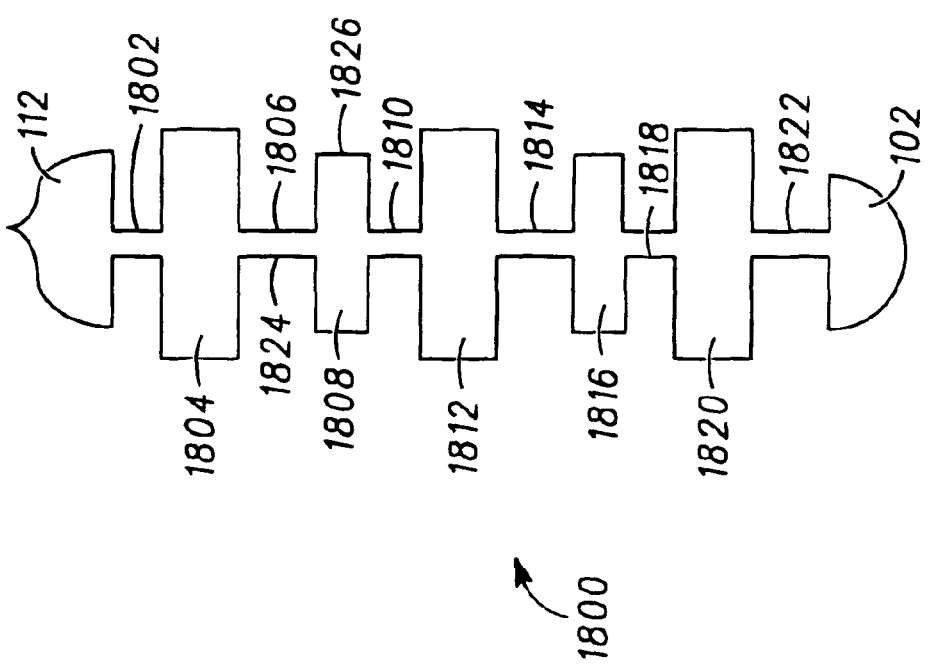
FIG. 18 is a broken out plan view of a support beam that is used in the MEMS resonator shown in FIGS. 1–3 according to a fourteenth alternative embodiment of the invention.

FIG. 18 is a broken out plan view of a support beam 1800 that is used in the MEMS resonator shown in FIGS. 1–3 according to a fourteenth alternative embodiment of the invention. The width of fourteenth alternative support beam 1800 varies periodically along its length. A first beam section 1802 is characterized by a narrow width, and a short length. The first beam section 1802 is connected to the surrounding portion of the first film 112. A second beam section 1804 is connected to the first beam section 1802. The second beam section 1804 is characterized by a large width, and a long length. A third beam section 1806 is connected to the second beam section 1804. The third beam section 1806 is characterized by the narrow width and the long length. A fourth beam section 1808 is connected to the third beam section 1806. The fourth beam section 1808 is characterized by a medium width and the short length. Connected between the fourth beam section 1808 and the main beam 102 are, in sequence, a fifth beam section 1810, a sixth beam section 1812, a seventh beam section 1814, an eight beam section 1816, a ninth beam section 1818, a tenth beam section 1820, and an eleventh beam section 1822. The fifth 1810 and ninth 1818 beam sections have the same dimensions as the first beam section. The sixth 1812 and tenth 1820 beam sections have the same dimensions as the first beam section 1804. The seventh 1814 and eleventh 1822 beam sections have the same dimensions as the third beam section 1806. The fourteenth alternative support beam 1800 comprises a first corrugated side edge 1824, and a second corrugated side edge 1826.

Figure 19:
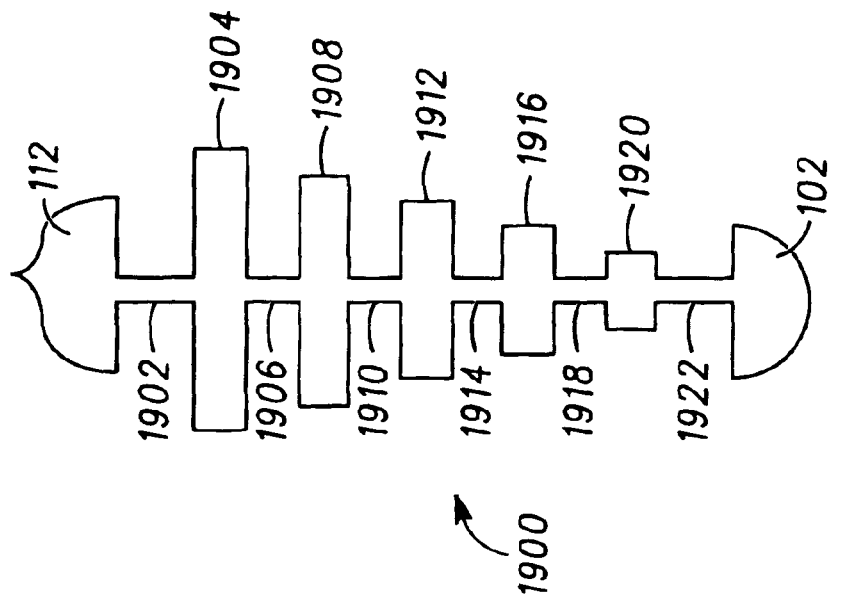
FIG. 19 is a broken out plan view of a support beam that is used in the MEMS resonator shown in FIGS. 1–3 according to a fifteenth alternative embodiment of the invention.

FIG. 19 is a broken out plan view of a support beam 1900 that is used in the MEMS resonator shown in FIGS. 1–3 according to a fifteenth alternative embodiment of the invention. The fifteenth alternative support beam 1900 comprises a plurality of narrow beam sections 1902, 1906, 1910, 1914, 1918, 1922 that are interspersed with a plurality of wider beam sections 1904, 1908, 1912, 1916, 1920, that are arranged in order of their widths. The widest 1904 of the wider beam sections 1904, 1908, 1912, 1916, 1920 is located near the main beam 102.

Although one particular resonator design using corrugated support beams has been shown in FIGS. 1–3 the corrugated support beams shown in FIGS. 4–19 of the present application are also advantageously used in other resonators such as shown in FIGS. 13–16 in copending application Ser. No. 09/828,431.

One such alternative resonator 2000 is shown in FIG. 20. FIG. 20 is a resonator that employs two corrugated support beams 2004, 2006 of the type shown in FIG. 4. The two support beams 2004, 2006 attach to opposite longitudinal edges of a main beam 2002 at its longitudinal center 2002A. The support beams 2004, 2006 serve as torsional hinges that allow the main beam 2002 to flex in a flexural mode in which a portion of the beam 2002 in the vicinity of its longitudinal center 2002A rotates in an oscillatory fashion about an axis that passes through the support beams 2004, 2006.

A first conductive pathway 2008 runs from a first ohmic contact 2010, that is located on the surrounding portion of the first film 112, onto and along the length of the first support beam 2004, onto and along the main beam 2002 to a first electrode area 2012 that is located on a first side of the longitudinal center 2002A. A second conductive pathway 2014 runs from a second ohmic contact 2016 that is located on the surrounding portion of the first film 112, onto and along the length of the second support beam 2006, onto the main beam 2002, and along the main beam 2002 to a second electrode area 2018 that is located on a second side of the longitudinal center 2002A. The first 2012 and second 2018 electrode areas are preferably located at the positions of two antinodes (positions of maximum displacement) of the flexural beam mode in which the main beam 2002 resonates. The first 2010 and second 2016 ohmic contacts, first 2008, and second 2014 conductive pathways, first 2012, and second 2018 electrode areas are preferably formed by patternwise ion implant doping the first film 112 prior to an etching operation that defines the main beam 2002, and the first 2004 and second 2006 support beams. Doped areas are shown as cross hatched areas in FIG. 20. The doping may be N or P type. The first film preferably comprises doping of an opposite type (e.g., background doping) relative to the doping used to define the foregoing features. Consequently in operation, for any voltage difference between the first conductive pathway 2008 and the second conductive pathway 2010 there is always at least one reversed biased PN junction separating the first 2008 and second 2014 conductive pathways.

In operation a bias signal plus a first phase of a differential signal may be applied to the first ohmic contact 2010 and the bias signal plus an opposite phase of the differential signal may be applied to the second ohmic contact 2016. The base layer 116 is preferably held at a fixed potential. The differential signal will establish a first periodic attractive force between the first electrode area 2012 and the base layer 116, and a second periodic attractive force between the second electrode area 2018 and the base layer. Owing to the fact that the signal is differential, there is a one-half cycle phase difference between the first periodic attractive force and the second periodic attractive force. As the strength of the first attractive force increases the strength of the second attractive force decreases and vice versa. The main beam 2002 is driven to resonate in an anti symmetric flexural beam mode in which the center portion of the main beam oscillates through a limited angular range with the first 2004 and second 2006 support beams serving as torsional springs.

According to the invention, torsional hinges in the form of support beams that have corrugated edges, support beams that are perforated and/or support beams that have non-uniform widths, and preferably narrow width at at least an end that connects to flexural beams are provided. Such support beams reduce the loss of acoustic energy from resonators in which they are used. Such support beams may be made shorter than uniform width support beams that have phase lengths of $\pi/2$ at a given frequency, and therefore allow for reduced size resonators to be fabricated on semiconductor dies.

While the preferred and other embodiments of the invention have been illustrated and described, it will be clear that the invention is not so limited. Numerous modifications, changes, variations, substitutions, and equivalents will occur to those of ordinary skill in the art without departing from the spirit and scope of the present invention as defined by the following claims.

What is claimed is:

1. A Micro ElectroMechanical system comprising:
   a first torsional hinge that includes:
   a first end;
   a second end; and
   a first corrugated side edge.

2. The Micro ElectroMechanical system according to claim 1 wherein: the corrugated side edge has periodic profile.

3. The Micro ElectroMechanical system according to claim 1 wherein:
   the first torsional hinge includes a second corrugated edge.

4. The Micro ElectroMechanical system according to claim 1 wherein the first torsional hinge comprises:
   a plurality of wide beam sections that are characterized by a length dimension; and
   a plurality of narrow beam sections that alternate in position with the wide beam sections and are characterized by about the length dimension.

5. The Micro ElectroMechanical system according to claim 1 wherein: the first torsional hinge is characterized by a minimum width, and an average width, and the average width is between about 1.5 and about 7 times the minimum width.

6. The Micro ElectroMechanical system according to claim 5 wherein: the average width is between about 2 and about 5 times the minimum width.

7. The Micro ElectroMechanical system according to claim 6 wherein the first torsional hinge has:
   a plurality of abrupt increases in width that are interspersed with a plurality of abrupt decreases in width.

8. The Micro ElectroMechanical system according to claim 1 wherein the first torsional hinge comprises:
   a monocrystalline silicon material that extends at least, from the first end to the second end.

9. The Micro ElectroMechanical system according to claim 8 wherein:
   the monocrystalline silicon material includes an ion implanted dopant conductive pathway.

10. The Micro ElectroMechanical system according to claim 1 further comprising:
    an anchor coupled to the first end of the first torsional hinge;
    a resonant member that is dimensioned to resonate at a first frequency and is coupled to the second end of the first torsional hinge;
    wherein the first torsional hinge has a phase length that is equal to about an odd multiple of $\pi/2$ in a torsional mode at the first frequency.

11. The Micro ElectroMechanical system according to claim 10 wherein:
    the torsional hinge has a phase length that is equal to about $\pi/2$ in the torsional mode at the first frequency.

12. The Micro ElectroMechanical system according to claim 10 further comprising:
    a conductive pathway from the anchor, along the first torsional hinge and onto the resonant member.

13. The Micro ElectroMechanical system according to claim 10 wherein:
    the resonant member comprises a monocrystalline material layer; and
    the elongated beam comprises the monocrystalline material layer.

14. The Micro ElectroMechanical system according to claim 13 further comprising:
    an ion implant doped conductive pathway from the anchor, along the first torsional hinge and onto the resonant member.

15. The Micro ElectroMechanical system according to claim 10 wherein:
    the resonant member is a beam that extends perpendicular to the first torsional hinge and is resonant in a flexural beam mode that includes a first node; and
    the second end of the first torsional hinge is coupled to the beam at the first node.

16. The Micro ElectroMechanical system according to claim 15 further comprising:
    a conductive pathway from the anchor, along the first torsional hinge, and onto the beam.

17. The Micro ElectroMechanical system according to claim 16 wherein:
    the beam comprises a monocrystalline material layer;
    the first torsional hinge comprises the monocrystalline material layer.

18. The Micro ElectroMechanical system according to claim 17 wherein:
    the monocrystalline material layer includes a first semiconductor.

19. The Micro ElectroMechanical system according, to claim 17 wherein:
    the anchor comprises:
    the monocrystalline material layer;
    a second material layer underlying the monocrystalline material layer; and
    a base layer underlying the second material layer.

20. The Micro ElectroMechanical system according to claim 19 wherein:
    the second material layer includes an oxide; and
    the base layer comprises a semiconductor.

21. The Micro ElectroMechanical system according to claim 20 wherein:
    the monocrystalline material layer comprises silicon;
    the second material layer comprises silicon dioxide; and
    the base layer comprises silicon.

22. The Micro ElectroMechanical system according to claim 20 wherein:
    the monocrystalline material layer comprises a III–V semiconductor;
    the second material layer comprises a perovskite; and
    the base layer comprises a group IV semiconductor.

23. The Micro ElectroMechanical system according to claim 15 wherein:
    the beam includes:
    a first longitudinal edge; and
    a second longitudinal edge; and
    the Micro ElectroMechanical system further comprises:
    a second torsional hinge that has
    a first end;
    a second end; and
    a corrugated side edge;
    the second end of the first torsional hinge is coupled to the first longitudinal edge of the beam;
    the second end of the second torsional hinge is coupled to the second longitudinal edge of the beam at the first node; and
    the second torsional hinge has a phase length that is equal to about an odd multiple of $\pi/2$ in a torsional mode at about the first frequency.

24. The Micro ElectroMechanical system according to claim 23 wherein the flexural beam mode includes a second node; and the Micro ElectroMechanical system further comprises:
a third torsional hinge that includes:
a first end;
a second end; and
a corrugated side edge;
a fourth torsional hinge that includes:
a first end;
a second end; and
a corrugated side edge;
the second end of the third torsional hinge is coupled first longitudinal edge of the beam at the second node;
the second end of the fourth torsional hinge is coupled to the second longitudinal edge of the beam at the second node;
the third torsional hinge has a phase length that is equal to about an odd multiple of $\pi/2$ in a torsional mode at the first frequency; and
the fourth torsional hinge has a phase length that is equal to about an odd multiple of $\pi/2$ in a torsional mode at the first frequency.

25. The Micro ElectroMechanical system according to claim 24 wherein the first torsional hinge, the second torsional hinge, the third torsional hinge, and the fourth torsional hinge have phase lengths that are about equal to $\pi/2$ at the first frequency.

26. A Micro ElectroMechanical system comprising:
a torsional hinge including
a first torsional hinge that includes:
a first end;
a second end; and
is characterized by:
a length dimension measured between the first end and the second end;
a width that is measured perpendicular to the length dimension and varies as a function of position along the length; and
the torsional hinge comprises:
a first tapered section that is located at the first end and in which the width increases continuously as a distance from the first end increases; and
a second tapered section that is located at the second end and in which the width increases continuously as a distance from the second end increases.

27. The Micro ElectroMechanical system according to claim 26 wherein:
the torsional hinge comprises:
a first narrow width section at the first end.

28. The Micro ElectroMechanical system according to claim 27 wherein:
the torsional hinge further comprises:
a second narrow width portion at the second end.

29. The Micro ElectroMechanical system according to claim 26 wherein:
a first width measured at the first end has a first value; and
widths measured at all positions between the first end and the second end are equal to at least about the first value.

30. A Micro ElectroMechanical system comprising:
a torsional hinge including
a first torsional hinge that includes:
a first end
a second end; and
is characterized by:
a length dimension measured between the first end and the second end; and
a width that is measured perpendicular to the length dimension and varies as a function of position alone the length; and
wherein:
a second width measured at the second end has a second value; and
the width measured at all positions between the first end and the second end is at least about equal to the second value; and
further comprising:
a anchor coupled to the first end of the torsional hinge; and
a flexural mode resonant beam coupled to the second end of the torsional hinge.

31. A Micro ElectroMechanical system comprising:
a torsional hinge that includes:
a first end;
a second end; and
a plurality of holes through the torsional hinge.

32. The Micro ElectroMechanical system according to claim 31 further comprising:
an anchor coupled to the first end of the first torsional hinge;
a resonant member that is dimensioned to resonate at a first frequency and is coupled to the second end of the first torsional hinge;
wherein the first torsional hinge has a phase length that is equal to about an odd multiple of $\pi/2$ in a torsional mode at the first frequency.

33. The Micro ElectroMechanical system according to claim 32 wherein:
the resonant member is a beam that extends perpendicular to the first torsional hinge and is resonant in a flexural beam mode that includes a first node; and
the second end of the first torsional hinge is coupled to the beam at the first node.

* * * * *

UNITED STATES PATENT AND TRADEMARK OFFICE
CERTIFICATE OF CORRECTION

PATENT NO. : 6,710,680 B2
DATED : March 23, 2004
INVENTOR(S) : Niu, Feng et al.

It is certified that error appears in the above-identified patent and that said Letters Patent is hereby corrected as shown below:

Column 16,
Line 19, delete "a" and insert -- an --.
Line 20, delete "alone" and insert -- along --

Signed and Sealed this

First Day of February, 2005

JON W. DUDAS
*Director of the United States Patent and Trademark Office*